United States Patent
Vorndran (10) Patent No.: US 10,466,314 B2
(45) Date of Patent: Nov. 5, 2019

(54) INTEGRATED CURRENT SENSOR

(71) Applicant: Hamilton Sundstrand Corporation, Charlotte, NC (US)

(72) Inventor: John Vorndran, Roscoe, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 73 days.

(21) Appl. No.: 15/898,040

(22) Filed: Feb. 15, 2018

(65) Prior Publication Data

US 2019/0250221 A1 Aug. 15, 2019

(51) Int. Cl.
| | |
|---|---|
| *G01R 33/07* | (2006.01) |
| *G01R 19/00* | (2006.01) |
| *H01F 27/28* | (2006.01) |
| *H01F 27/245* | (2006.01) |
| *H05K 1/18* | (2006.01) |
| *H05K 1/14* | (2006.01) |
| *H05K 1/11* | (2006.01) |

(52) U.S. Cl.
CPC ....... *G01R 33/072* (2013.01); *G01R 19/0092* (2013.01); *H01F 27/245* (2013.01); *H01F 27/2847* (2013.01); *H05K 1/115* (2013.01); *H05K 1/144* (2013.01); *H05K 1/18* (2013.01); *H05K 2201/041* (2013.01); *H05K 2201/10151* (2013.01)

(58) Field of Classification Search
CPC .. G01R 33/072; G01R 19/0092; H05K 1/115; H05K 1/144; H05K 1/18; H01F 27/245
USPC ........................................................ 324/260
See application file for complete search history.

(56) References Cited

U.S. PATENT DOCUMENTS

| | | | | | |
|---|---|---|---|---|---|
| 3,339,129 | A | * | 8/1967 | Harpster | ................. H01L 43/04 257/422 |
| 5,146,156 | A | * | 9/1992 | Marcel | ................. G01R 15/202 324/117 H |
| 5,386,188 | A | * | 1/1995 | Minneman | ......... G01R 19/0092 324/126 |
| 5,416,407 | A | * | 5/1995 | Drafts | ................... G01R 15/202 324/117 H |
| 5,552,700 | A | * | 9/1996 | Tanabe | ................. G01R 15/202 324/117 H |
| 5,736,846 | A | * | 4/1998 | Floru | ..................... G01R 15/18 324/127 |
| 5,767,667 | A | * | 6/1998 | Shafie | ................... G01R 15/186 324/117 R |
| 5,850,142 | A | * | 12/1998 | Rountos | ................. G01D 5/145 324/207.2 |

(Continued)

*Primary Examiner* — Christopher P McAndrew (57) ABSTRACT

A printed circuit board assembly includes a current sense trace to transmit an electrical signal through the assembly. The assembly includes a magnetic core including an opening for receiving the current sense trace and includes first stack layers and second stack layers that each define opposing sides of the opening, and elongate layers that extend from the first stack layers to the second stack layers and define additional opposing sides of the opening. The assembly further includes a Hall effect sensor located in the first stack layers or the second stack layers and configured to detect Hall effect data corresponding to a first Hall effect current of the electrical signal having a DC frequency. The assembly further includes a coil wrapped around the first stack layers or the second stack layers and configured to detect coil data corresponding to an AC component of the signal.

17 Claims, 5 Drawing Sheets

(56) References Cited

U.S. PATENT DOCUMENTS

| | | | |
|---|---|---|---|
| 6,545,456 B1* | 4/2003 | Radosevich | G01R 15/202 324/117 H |
| 6,611,137 B2 | 8/2003 | Haensgen et al. | |
| 6,989,665 B2* | 1/2006 | Goto | G01R 15/202 324/117 H |
| 7,164,263 B2 | 1/2007 | Yakymyshyn et al. | |
| 7,622,909 B2* | 11/2009 | Teppan | G01R 33/04 324/117 H |
| 7,821,252 B2* | 10/2010 | Lepine | G01R 15/207 324/117 H |
| 9,053,845 B2* | 6/2015 | Catalano | H01F 5/003 |
| 9,476,915 B2* | 10/2016 | Ausserlechner | G01R 15/202 |
| 9,841,485 B2* | 12/2017 | Petrie | G01R 31/2884 |
| 2004/0080308 A1* | 4/2004 | Goto | G01R 15/202 324/117 H |
| 2005/0188118 A1* | 8/2005 | Richardson | G06F 13/409 710/16 |
| 2010/0156394 A1* | 6/2010 | Ausserlechner | G01R 15/202 324/144 |
| 2012/0299587 A1* | 11/2012 | Rieger | G01R 33/0206 324/247 |
| 2013/0187636 A1* | 7/2013 | Kast | G01R 21/00 324/127 |
| 2014/0253100 A1* | 9/2014 | Lepine | G01R 19/00 324/126 |
| 2015/0325364 A1* | 11/2015 | Lee | H01F 17/045 336/192 |
| 2017/0010309 A1 | 1/2017 | Etschmaier | |
| 2017/0322237 A1* | 11/2017 | Hanley | G01R 15/202 |
| 2018/0020552 A1* | 1/2018 | Khoshamouz | H05K 3/4644 |
| 2018/0063944 A1* | 3/2018 | Goud | H05K 1/0245 |

* cited by examiner

INTEGRATED CURRENT SENSOR

FIELD

The present disclosure is directed to current sensors integrated into printed circuit board assemblies, and methods of detecting currents using such current sensors.

BACKGROUND

Real-time current sensing may be desirable in various situations, such as in motor drives, power conversion systems, power sources, and the like. It is desirable for such current sensors to be relatively accurate, relatively small, relatively efficient, and to generate relatively little heat. Conventional current sensors may include resistors which generate heat which results in energy losses and may potentially damage nearby equipment as well as the resistor itself. Thus, it is desirable for optimized current sensors to be developed.

SUMMARY

Described herein is a printed circuit board assembly. The printed circuit board assembly includes a current sense trace configured to transmit an electrical signal through the printed circuit board assembly, a current of the electrical signal to be measured by the printed circuit board assembly. The printed circuit board assembly further includes a magnetic core that defines an opening for receiving the current sense trace and includes a plurality of first stack layers and a plurality of second stack layers that each define opposing sides of the opening, and a plurality of elongate layers that extend from at least one of the plurality of first stack layers to at least one of the plurality of second stack layers and define additional opposing sides of the opening. The printed circuit board assembly further includes a first Hall effect sensor located in at least one of the plurality of first stack layers or the plurality of second stack layers and configured to detect first Hall effect data corresponding to a first Hall effect current of the electrical signal having a frequency between zero hertz and a first frequency value. The printed circuit board assembly further includes a first coil wrapped around the at least one of the plurality of first stack layers or the plurality of second stack layers and configured to detect first coil data corresponding to a first higher-frequency component of the current of the electrical signal having a greater frequency than the first frequency value.

In any of the foregoing embodiments, the first Hall effect sensor includes a different material than the magnetic core and includes a first pair of opposing leads for receiving an applied voltage and a second pair of opposing leads that are oriented perpendicular to the first pair of opposing leads for outputting the first Hall effect data.

In any of the foregoing embodiments, the different material of the first Hall effect sensor includes at least one of indium arsenide, indium antimonide, or gallium arsenide.

Any of the foregoing embodiments may also include a first conductive via having a first lead connected to a first end of the first coil, and a second conductive via having a second lead connected to a second end of the first coil such that the first coil data can be provided to a location outside of the printed circuit board assembly.

In any of the foregoing embodiments, the first conductive via and the second conductive via extend to at least a first outer surface or a second outer surface of the printed circuit board assembly.

Any of the foregoing embodiments may also include a laminate positioned between the first Hall effect sensor and adjacent layers of the at least one of the plurality of first stack layers or the plurality of second stack layers.

In any of the foregoing embodiments, the magnetic core includes a ferrite.

In any of the foregoing embodiments, the current sense trace receives the electrical signal from a source external to the printed circuit board assembly and outputs the electrical signal to the source or another source external to the printed circuit board assembly.

In any of the foregoing embodiments, at least some of the plurality of elongate layers are the same as some of the plurality of first stack layers and the plurality of second stack layers and together create a first stack and a second stack.

Any of the foregoing embodiments may also include a second Hall effect sensor located in the other of the plurality of first stack layers or the plurality of second stack layers and configured to detect second Hall effect data corresponding to a second Hall effect current of the electrical signal having the frequency between zero hertz and the first frequency value; and a second coil wrapped around the other of the plurality of first stack layers or the plurality of second stack layers and configured to detect second coil data corresponding to a second higher-frequency component of the current of the electrical signal.

Also disclosed is a current sensor. The current sensor includes a plurality of printed circuit boards stacked above each other. The plurality of printed circuit boards includes a current sense trace configured to receive an electrical signal and transmit the electrical signal through the current sensor, a magnetic core having a first stack, a second stack, and a plurality of elongate layers that extend from the first stack to the second stack, the first stack, the second stack, and the plurality of elongate layers defining an opening for receiving the current sense trace, a first Hall effect sensor located in the first stack of the magnetic core and configured to detect first Hall effect data corresponding to a first Hall effect current of the electrical signal having a frequency between zero hertz and a first frequency value, and a first coil wrapped around the first stack of the magnetic core and configured to detect first coil data corresponding to a first higher-frequency component of a current of the electrical signal having a greater frequency than the first frequency value.

In any of the foregoing embodiments, the first Hall effect sensor includes a different material than the magnetic core and includes a first pair of opposing leads for receiving an applied voltage and a second pair of opposing leads that are oriented perpendicular to the first pair of opposing leads for outputting the first Hall effect data.

Any of the foregoing embodiments may also include a first conductive via having a first lead connected to a first end of the first coil, and a second conductive via having a second lead connected to a second end of the first coil such that the first coil data can be provided to a location outside of the current sensor on the first conductive via and the second conductive via.

In any of the foregoing embodiments, the first conductive via and the second conductive via extend to at least a first outer surface or a second outer surface of the current sensor.

Any of the foregoing embodiments may also include a laminate positioned between the first Hall effect sensor and adjacent layers of the first stack.

In any of the foregoing embodiments, the magnetic core includes a ferrite.

Also disclosed is a method for detecting current. The method includes receiving, by a current sense trace formed in a printed circuit board assembly, an electrical signal. The method also includes receiving, by a magnetic core through which the current sense trace passes and which is also formed in the printed circuit board assembly, a magnetic field that corresponds to a current of the electrical signal. The method also includes applying, via a power source, a voltage across a first Hall effect sensor located in a first stack of the magnetic core. The method also includes detecting, by the first Hall effect sensor, first Hall effect data corresponding to a first Hall effect current of the electrical signal having a frequency between zero hertz and a first frequency value. The method also includes detecting, by a first coil wound around the first stack of the magnetic core, first coil data corresponding to a first higher-frequency component of the current of the electrical signal having a greater frequency than the first frequency value.

Any of the foregoing embodiments may also include receiving, at a via that extends to a first outer surface or a second outer surface of the printed circuit board assembly, at least a portion of the first coil data.

Any of the foregoing embodiments may also include applying, via the power source, the voltage across a second Hall effect sensor located in a second stack of the magnetic core; detecting, by the second Hall effect sensor, second Hall effect data corresponding to a second Hall effect current of the electrical signal having the frequency between zero hertz and the first frequency value; and detecting, by a second coil wound around a second stack of the magnetic core, second coil data corresponding to a second higher-frequency component of the current of the electrical signal having the greater frequency than the first frequency value.

Any of the foregoing embodiments may also include receiving, at a controller, the first Hall effect data, the second Hall effect data, the first coil data, and the second coil data; and calculating, by the controller, a first portion of the current of the electrical signal and a second portion of the current of the electrical signal based on the first Hall effect data, the second Hall effect data, the first coil data, and the second coil data.

The forgoing features and elements may be combined in various combinations without exclusivity, unless expressly indicated herein otherwise. These features and elements as well as the operation of the disclosed embodiments will become more apparent in light of the following description and accompanying drawings.

BRIEF DESCRIPTION OF THE DRAWINGS

The subject matter of the present disclosure is particularly pointed out and distinctly claimed in the concluding portion of the specification. A more complete understanding of the present disclosures, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration and their best mode. While these exemplary embodiments are described in sufficient detail to enable those skilled in the art to practice the disclosure, it should be understood that other embodiments may be realized and that logical, chemical, and mechanical changes may be made without departing from the spirit and scope of the disclosure. Thus, the detailed description herein is presented for purposes of illustration only and not of limitation. For example, the steps recited in any of the method or process descriptions may be executed in any order and are not necessarily limited to the order presented. Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact.

Figure 1:
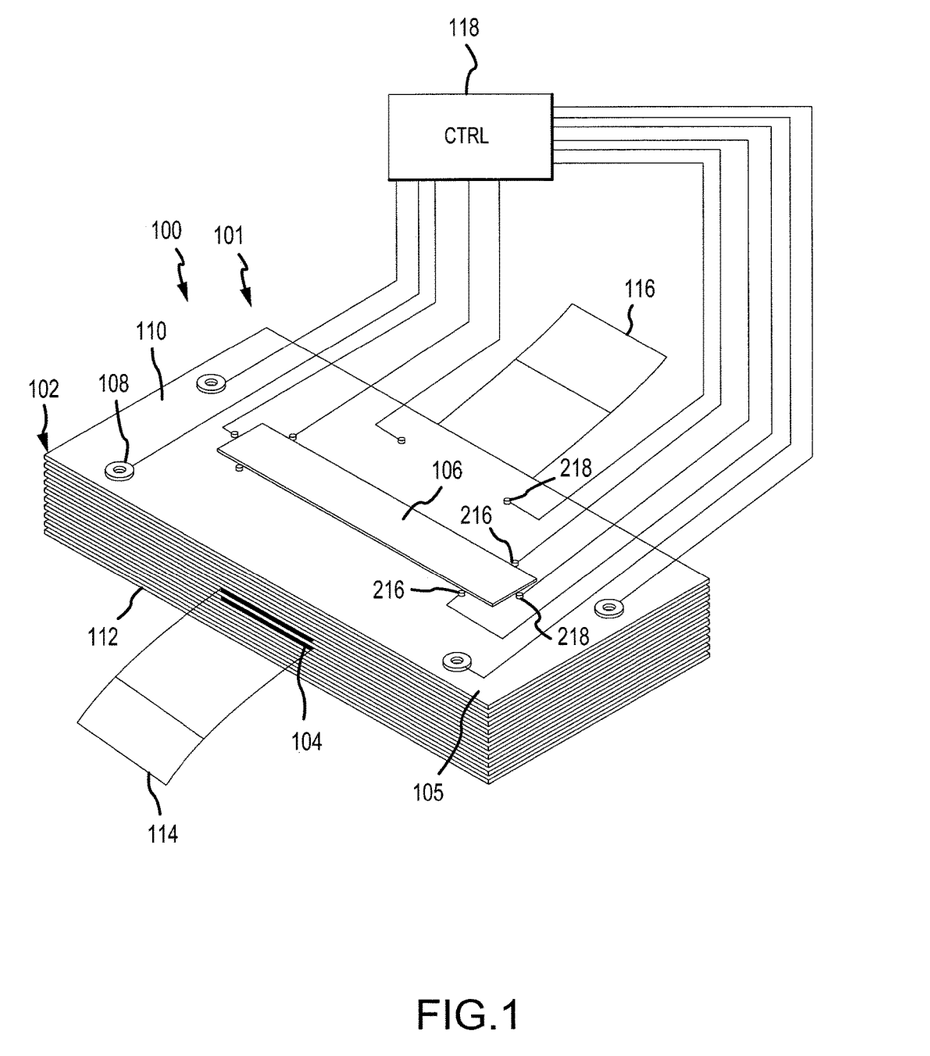
FIG. 1 illustrates a printed circuit board assembly having an integrated current sensor, in accordance with various embodiments of the present disclosure.

Referring to FIG. 1, a current sensor 100 may be integrated into a printed circuit board assembly 101. The printed circuit board assembly 101 may include a plurality of printed circuit boards 102. Each of the plurality of printed circuit boards 102 may include a laminate 105, such as a glass-reinforced epoxy laminate material (e.g., National Electrical Manufacturers Association designation FR-4), with a plurality of metal or magnetic traces positioned thereon. Integrating the current sensor 100 into the printed circuit board assembly 101 provides various advantages, including, in various embodiments, such as the ability to have a single device that provides a desired function (such as functioning as a power supply or logic device) and has current monitoring capabilities.

The printed circuit board assembly 101 may also include a current sense trace 104 that may receive an electrical signal from a signal source 114. The current sense trace 104 may further transmit the electrical signal to a signal receiver 116. At least one of the signal source 114 or the signal receiver 116 may be located external to the printed circuit board assembly 101. In various embodiments, at least one of the signal source 114 or the signal receiver 116 are located in internal relative to the printed circuit board assembly 101 (i.e., formed either integral or monolithic with the printed circuit board assembly 101).

The printed circuit board assembly 101 may also include a magnetic core 106. As will be described below, the magnetic core 106 may include multiple (i.e., a plurality of) layers.

The printed circuit board assembly 101 may further include a plurality of conductive vias 108. The conductive vias 108 may facilitate transfer of a signal from inside of the printed circuit board assembly 101 to at least one of a first outer surface 110 or a second outer surface 112.

The current sensor 100 may be designed to detect values (i.e., amplitude, phase, frequency, or the like) corresponding to both direct current (DC) current as well as alternating current (AC) current of the signal on the current sense trace 104. In that regard, the current sensor 100 may include various components that provide detected data.

The current sensor 100 may further include a controller 118. The controller 118 may include a logic device such as one or more of a central processing unit (CPU), an accelerated processing unit (APU), a digital signal processor (DSP), a field programmable gate array (FPGA), an application specific integrated circuit (ASIC), or the like. In various embodiments, the controller 118 may further include any non-transitory memory known in the art. The memory may store instructions usable by the logic device to perform operations. The controller 118 may receive the detected data and may determine both the DC component and the AC component of the current of the electrical signal on the current sense trace 104.

Figure 2:
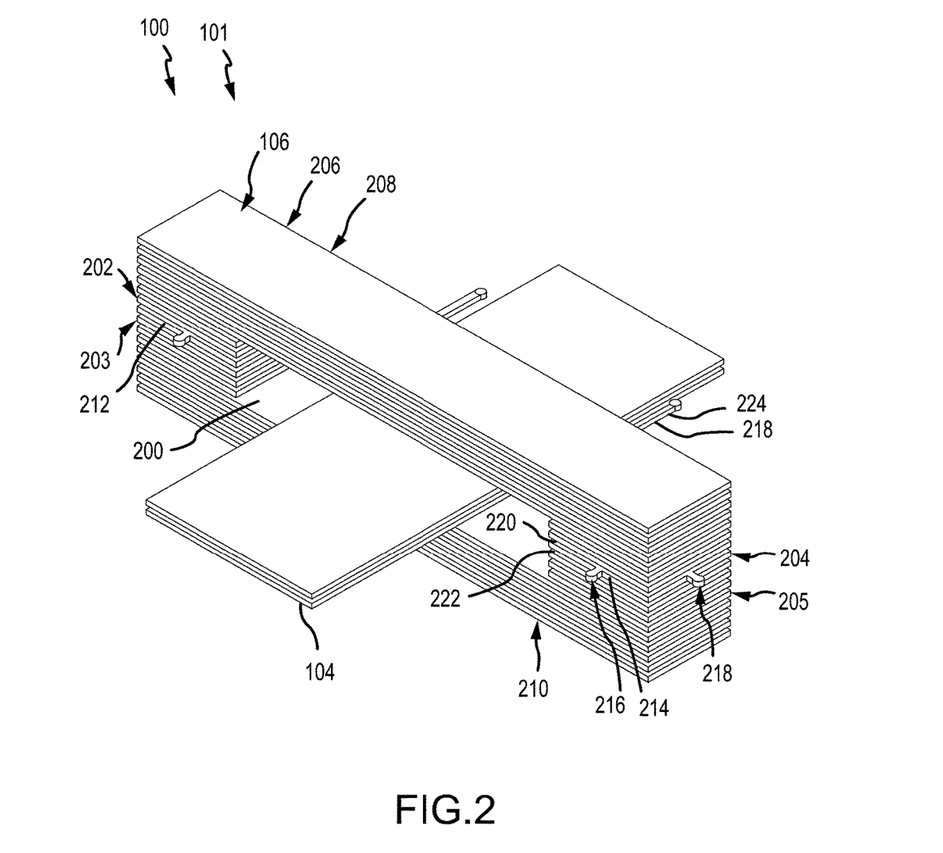
FIG. 2 illustrates a portion of the printed circuit board assembly of FIG. 1 illustrating a magnetic core and multiple Hall effect sensors, in accordance with various embodiments of the present disclosure.

Turning now to FIG. 2, the current sensor 100 is shown with some of the laminate 105 of FIG. 1 removed, and without a portion of the AC sensing component. As shown, the magnetic core 106 defines an opening 200 between its layers through which the current sense trace 104 extends. The magnetic core 106 includes a first stack 202 having a plurality of first stack layers 203, a second stack 204 having a plurality of second stack layers 205, and a plurality of elongate layers 206. In particular, the plurality of elongate layers 206 includes top elongate layers 208 and bottom elongate layers 210. In various embodiments, each of the top elongate layers 208 and the bottom elongate layers 210 may also form part of the first stack 202 and the second stack 204 (as shown). The first stack 202, the second stack 204, and the plurality of elongate layers 206 define the opening 200.

A first Hall effect sensor 212 may be positioned between two of the plurality of first stack layers 203, and a second Hall effect sensor 214 may be positioned between two of the plurality of second stack layers 205. Each of the Hall effect sensors 212, 214 may be isolated from the stack layers 203, 205 by a laminate. For example, the second Hall effect sensor 214 is isolated from the plurality of second stack layers 205 by a first laminate 220 and a second laminate 222. The first laminate 220 and the second laminate 222 may be insulating laminates and may have dielectric properties.

The magnetic core 106 may include any magnetic material. For example, the magnetic core 106 may include a ferrite such as Magnesium-Zinc (MgZn). The Hall effect sensors 212, 214 may include a different material. For example, the Hall effect sensors 212, 214 may include at least one of indium arsenide, indium antimonide, or gallium arsenide.

Each of the Hall effect sensors 212, 214 may include two pairs of opposing leads. For example, the second Hall effect sensor 214 includes a first pair of opposing leads 216 and a second pair of opposing leads 218. One pair of opposing leads (such as the first pair of opposing leads 216) may be designed to apply a voltage to the second Hall effect sensor 214, and the other pair of opposing leads (such as the second pair of opposing leads 218) may output a detected magnetic flux that corresponds to an amount of current transported by the current sense trace 104. The detected magnetic flux may be output onto a sensor lead 224 that is connected to one of the second pair of opposing leads 218 (the sensor lead 224 may also be referred to as one of the second pair of opposing leads 218).

The Hall effect sensors 212, 214 may be capable of receiving and outputting a magnetic flux that corresponds to a current having a frequency between 0 Hertz (Hz) (a DC frequency) and a first frequency value. In various embodiments, the first frequency value may be 5 kHz, 10 kHz, 20 kHz, or the like. In that regard, the current detected by the Hall effect sensors 212, 214 may be referred to as a DC component of a signal.

Figure 3:
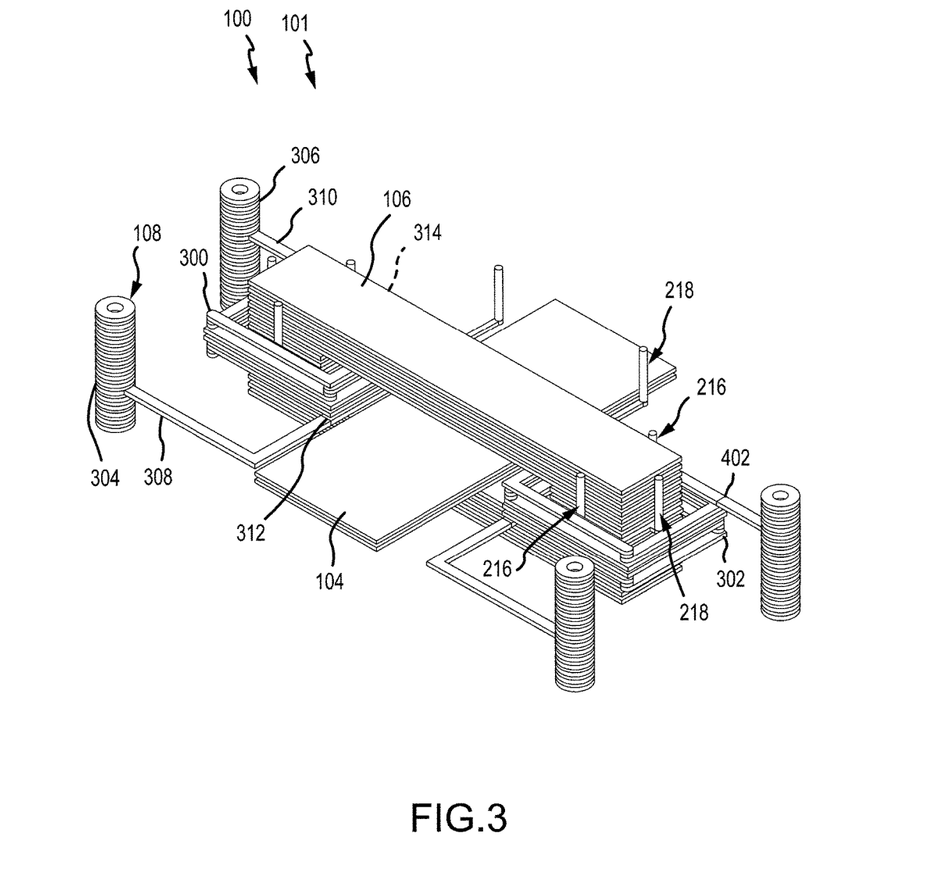
FIG. 3 illustrates a portion of the printed circuit board assembly of FIG. 1 without inclusion of a laminate, in accordance with various embodiments of the present disclosure.

In that regard and referring to FIGS. 2 and 3, the current sensor 100 may further include a first coil 300 wound around the first stack 202 (including the first Hall effect sensor 212), and a second coil 302 wound around the second stack 204 (including the second Hall effect sensor 214). A first conductive via 304 and a second conductive via 306 may each be electrically connected to one end of the first coil 300. In particular, the first conductive via 304 includes a first lead 308 that is electrically coupled to a first end 312 of the first coil 300. Likewise, the second conductive via 306 includes a second lead 310 that is electrically coupled to a second end 314 of the first coil 300. Additional conductive vias 108 may be similarly connected to the second coil 302.

The coils 300, 302 may be capable of detecting coil data that corresponds to an AC portion of the signal traveling along the current sense trace 104. In particular, the coils 300, 302 may detect a magnetic field that travels through the core 106 and corresponds to the AC portion of the signal. The coils 300, 302 may be designed to detect coil data that corresponds to a desirable frequency range between a first frequency and a second frequency. For example, if the Hall effect sensors 212, 214 detect Hall effect data that corresponds to current having a frequency of up to 10 kHz, then the coils 300, 302 may be designed to detect coil data that corresponds to current having a frequency of 10 kHz and greater. In various embodiments, the coil data may correspond to frequencies up to 5 MHz, 10 MHz, 20 MHz, 50 MHz, 1 GHz, or the like.

Referring to FIGS. 1, 2, and 3, the first pair of opposing leads 216 and the second pair of opposing leads 218 may extend through the first outer surface 110 of the printed circuit board assembly 101. In that regard, the controller 118 may be electrically coupled to each of the plurality of conductive vias 108 and each of the leads 216, 218 extending from the Hall effect sensors 212, 214. The controller 118 may apply the voltage to the Hall effect sensors 212, 214 and may receive the Hall effect data. The controller 118 may determine the DC portion of the current traveling through the current sense trace 104 based on the received Hall effect data.

The controller 118 may likewise receive the coil data from each of the plurality of conductive vias 108. The controller 118 may convert the coil data into detected current data that corresponds to the AC portion of the signal traveling through the current sense trace 104.

Figure 4:
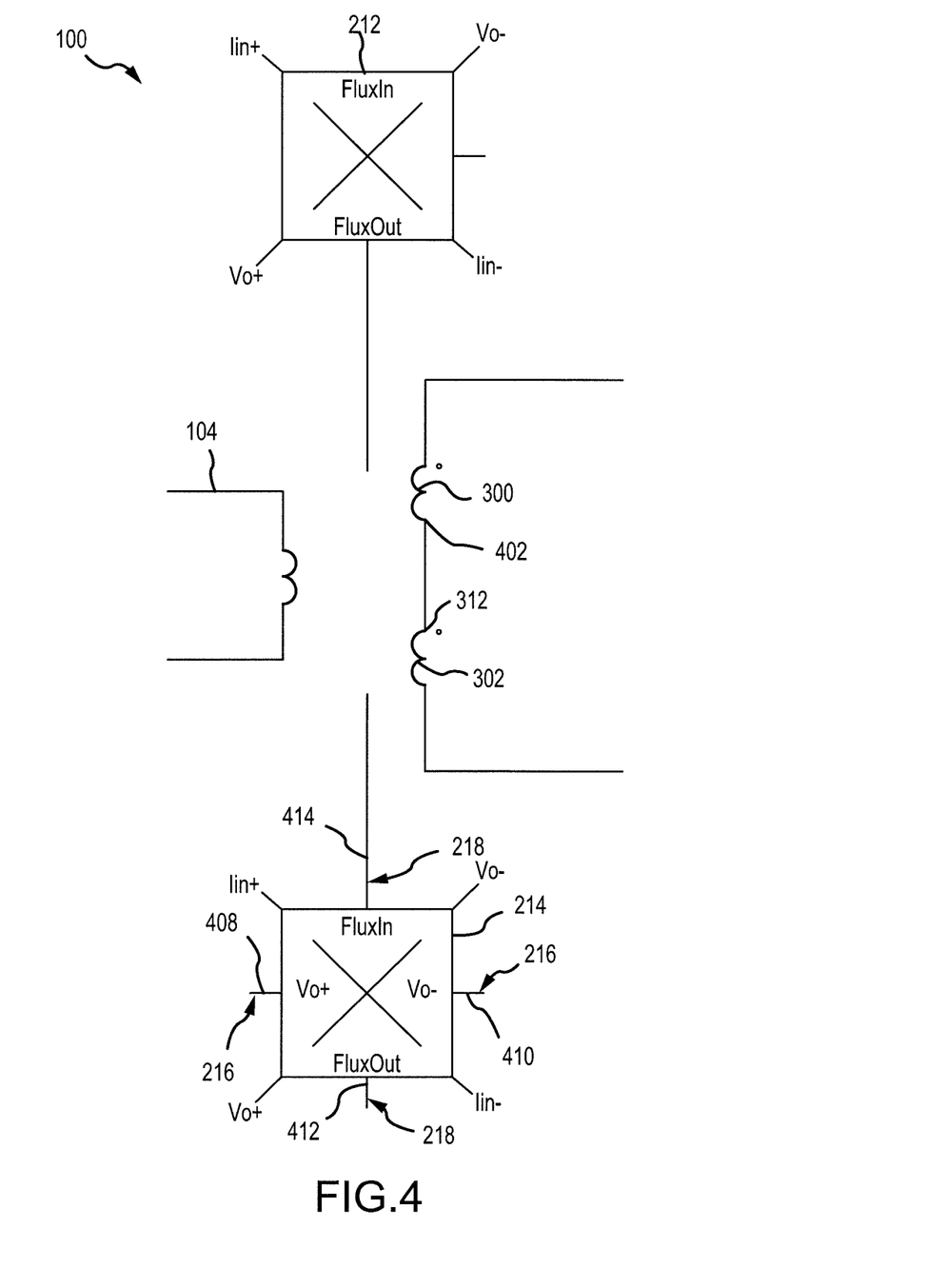
FIG. 4 illustrates a schematic showing operation of the current sensor of FIG. 1, in accordance with various embodiments of the present disclosure.

Referring now to FIGS. 2, 3, and 4, a schematic of the current sensor 100 is shown. As current travels through the current sense trace 104, a magnetic field may be received by the first coil 300 and the second coil 302. The magnetic field may correspond to the amplitude of the AC portion of the current traveling through the current sense trace 104. In that regard, the first coil 300 and the second coil 302, along with the current sense trace 104, may operate as a transformer (with the current sense trace 104 operating as one side of the transformer and the first coil 300 and the second coil 302 operating as the other side of the transformer).

As shown and in some embodiments, the first coil 300 and the second coil 302 may be connected in series. For example, the first end 312 of the first coil 300 may be connected to a second end 402 of the second coil 302. Connection of the coils 300, 302 in series may provide for greater accuracy of detection of the AC portion of the current signal due to the relatively low amplitude of the magnetic field received by the first coil 300 and the second coil 302.

As further shown, the second Hall effect sensor 214 includes the first pair of opposing leads 216 and the second pair of opposing leads 218. The first pair of opposing leads 216 includes a first lead 408 and a second lead 410. The second pair of opposing leads 218 includes a first lead 412 and a second lead 414. In various embodiments, the first lead 408 may receive a positive voltage (or a negative voltage) and the second lead 410 may receive a negative voltage (or a positive voltage).

As the magnetic flux is received by the magnetic core 106, it travels through the magnetic core 106 where it is received by the Hall effect sensors 212, 214. In response to voltage being applied to the second Hall effect sensor 214, the second Hall effect sensor 214 may receive and output Hall effect data on the second pair of opposing leads 218. This Hall effect data may correspond to an amplitude of the DC portion of the current (up to a first frequency value) that is traveling along the current sense trace 104. The first Hall effect sensor 212 may operate in a similar manner as the second Hall effect sensor 214. In that regard and referring to FIGS. 1 and 4, the controller 118 may determine the DC component of the signal traveling through the current sense trace 104 based on a combination of the Hall effect data from the first Hall effect sensor 212 and the second Hall effect sensor 214.

Figure 5:
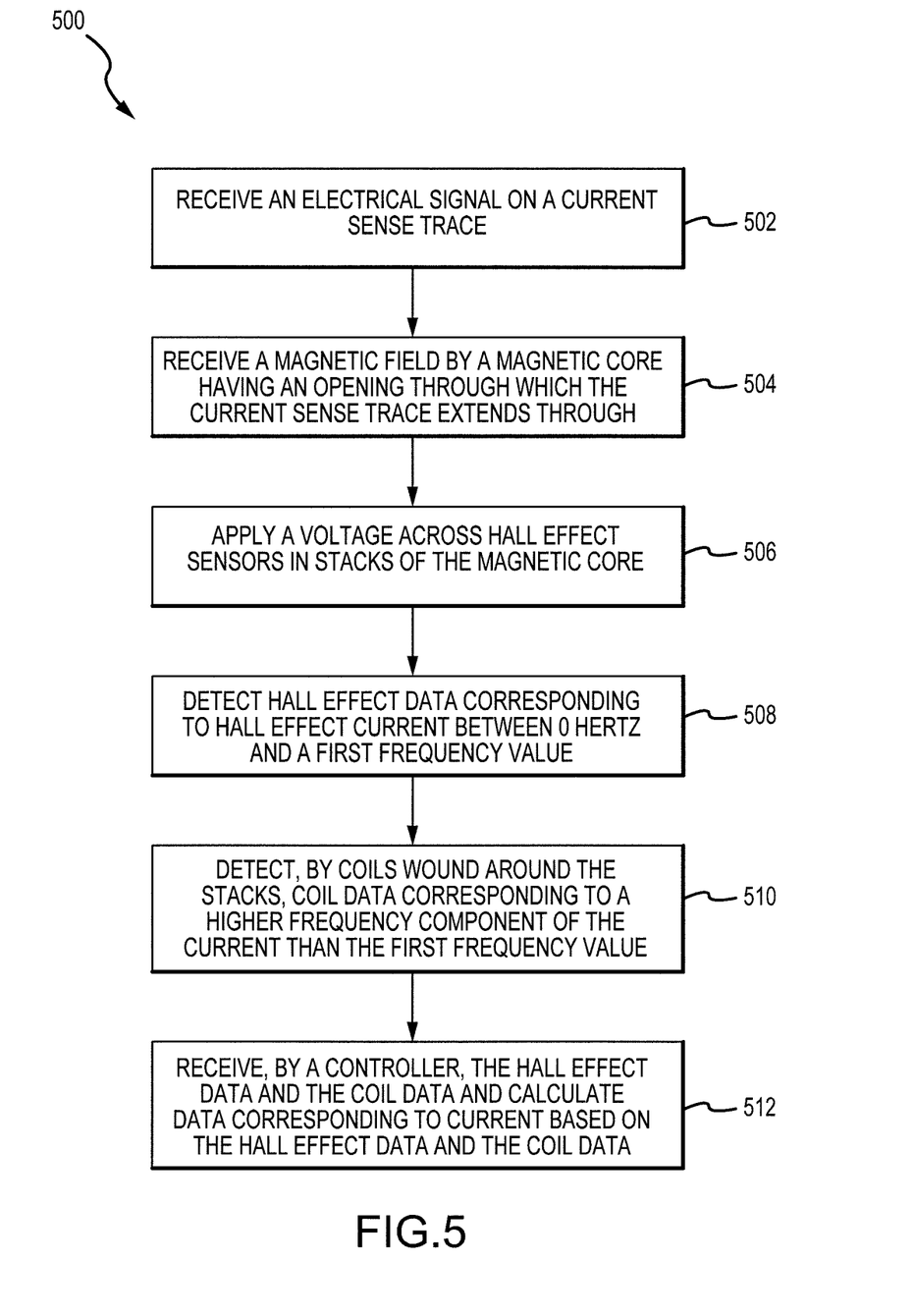
FIG. 5 illustrates a method for detecting a current using a current sensor integrated into a printed circuit board assembly, in accordance with various embodiments of the present disclosure.

Referring now to FIG. 5, a method 500 for detecting a current having a DC component and an AC component using a current sensor within a printed circuit board assembly, such as the current sensor 100 and printed circuit board assembly 101 of FIG. 1, is shown.

In block 502, an electrical signal may be received on a current sense trace. The electrical signal may include one or both of a DC component or an AC component.

In block 504, a magnetic core having an opening through which the current sense trace extends through may receive a magnetic field that corresponds to the electrical signal on the current sense trace. The magnetic core may have a shape similar to that of the magnetic core 106 shown in FIG. 2. The magnetic core may be formed in a printed circuit board assembly.

In block 506, a voltage may be applied across one or more Hall effect sensor that are located in stacks of the magnetic core. For example, the voltage may be a DC voltage and may be applied to a pair of opposing leads, each lead located on an opposite end of the corresponding Hall effect sensor.

In block 508, Hall effect data may be detected by the Hall effect sensors. The Hall effect data may correspond to an amplitude of current having a frequency that is between 0 hertz (true DC current) and a first frequency value (such as 10 kHz). In various embodiments, frequency between 0 Hz and the first frequency value may be referred to as a DC component of a current signal.

In block 510, coils that are wound around the Hall effect sensors may detect coil data that corresponds to a higher frequency component of the current that is received on the current sense trace. For example, the coil data may correspond to a frequency from a first frequency value (such as 5 kHz, 10 kHz, 15 kHz, or the like) to a second frequency value (such as 5 MHz, 10 MHz, 20 MHz, or the like).

In block 512, a controller may receive the Hall effect data and the coil data. The controller may calculate data corresponding to the current based on the Hall effect data and the coil data. For example, the controller may calculate an amplitude of an AC component of the current and an amplitude of a DC component of the current.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

Systems, methods and apparatus are provided herein. In the detailed description herein, references to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f) unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A printed circuit board assembly, comprising
   a current sense trace configured to transmit an electrical signal through the printed circuit board assembly, a current of the electrical signal to be measured by the printed circuit board assembly;
   a magnetic core that defines an opening for receiving the current sense trace and includes a plurality of first stack layers and a plurality of second stack layers that each define opposing sides of the opening, and a plurality of elongate layers that extend from at least one of the plurality of first stack layers to at least one of the plurality of second stack layers and define additional opposing sides of the opening;

a first Hall effect sensor located in at least one of the plurality of first stack layers or the plurality of second stack layers and configured to detect first Hall effect data corresponding to a first Hall effect current of the electrical signal having a frequency between zero hertz and a first frequency value;

a first coil wrapped around the at least one of the plurality of first stack layers or the plurality of second stack layers and configured to detect first coil data corresponding to a first higher-frequency component of the current of the electrical signal having a greater frequency than the first frequency value; and a first conductive via having a first lead connected to a first end of the first coil, and a second conductive via having a second lead connected to a second end of the first coil such that the first coil data can be provided to a location outside of the printed circuit board assembly.

2. The printed circuit board assembly of claim 1, wherein the first Hall effect sensor includes a different material than the magnetic core and includes a first pair of opposing leads for receiving an applied voltage and a second pair of opposing leads that are oriented perpendicular to the first pair of opposing leads for outputting the first Hall effect data.

3. The printed circuit board assembly of claim 2, wherein the different material of the first Hall effect sensor includes at least one of indium arsenide, indium antimonide, or gallium arsenide.

4. The printed circuit board assembly of claim 1, wherein the first conductive via and the second conductive via extend to at least a first outer surface or a second outer surface of the printed circuit board assembly.

5. The printed circuit board assembly of claim 1 further comprising a laminate positioned between the first Hall effect sensor and adjacent layers of the at least one of the plurality of first stack layers or the plurality of second stack layers.

6. The printed circuit board assembly of claim 1, wherein the magnetic core includes a ferrite.

7. The printed circuit board assembly of claim 1, wherein the current sense trace receives the electrical signal from a source external to the printed circuit board assembly and outputs the electrical signal to the source or another source external to the printed circuit board assembly.

8. The printed circuit board assembly of claim 1, wherein at least some of the plurality of elongate layers are the same as some of the plurality of first stack layers and the plurality of second stack layers and together create a first stack and a second stack.

9. The printed circuit board assembly of claim 1, further comprising:

a second Hall effect sensor located in the other of the plurality of first stack layers or the plurality of second stack layers and configured to detect second Hall effect data corresponding to a second Hall effect current of the electrical signal having the frequency between zero hertz and the first frequency value; and a second coil wrapped around the other of the plurality of first stack layers or the plurality of second stack layers and configured to detect second coil data corresponding to a second higher-frequency component of the current of the electrical signal.

10. A current sensor, comprising:

a plurality of printed circuit boards stacked above each other and including:

a current sense trace configured to receive an electrical signal and transmit the electrical signal through the current sensor, a magnetic core having a first stack, a second stack, and a plurality of elongate layers that extend from the first stack to the second stack, the first stack, the second stack, and the plurality of elongate layers defining an opening for receiving the current sense trace, a first Hall effect sensor located in the first stack of the magnetic core and configured to detect first Hall effect data corresponding to a first Hall effect current of the electrical signal having a frequency between zero hertz and a first frequency value, a first coil wrapped around the first stack of the magnetic core and configured to detect first coil data corresponding to a first higher-frequency component of a current of the electrical signal having a greater frequency than the first frequency value, and a first conductive via having a first lead connected to a first end of the first coil, and a second conductive via having a second lead connected to a second end of the first coil such that the first coil data can be provided to a location outside of the current sensor on the first conductive via and the second conductive via.

11. The current sensor of claim 10, wherein the first Hall effect sensor includes a different material than the magnetic core and includes a first pair of opposing leads for receiving an applied voltage and a second pair of opposing leads that are oriented perpendicular to the first pair of opposing leads for outputting the first Hall effect data.

12. The current sensor of claim 10, wherein the first conductive via and the second conductive via extend to at least a first outer surface or a second outer surface of the current sensor.

13. The current sensor of claim 10, further comprising a laminate positioned between the first Hall effect sensor and adjacent layers of the first stack.

14. The current sensor of claim 10, wherein the magnetic core includes a ferrite.

15. A method for detecting current, comprising:

receiving, by a current sense trace formed in a printed circuit board assembly, an electrical signal;

receiving, by a magnetic core through which the current sense trace passes and which is also formed in the printed circuit board assembly, a magnetic field that corresponds to a current of the electrical signal;

applying, via a power source, a voltage across a first Hall effect sensor located in a first stack of the magnetic core;

detecting, by the first Hall effect sensor, first Hall effect data corresponding to a first Hall effect current of the electrical signal having a frequency between zero hertz and a first frequency value;

detecting, by a first coil wound around the first stack of the magnetic core, first coil data corresponding to a first higher-frequency component of the current of the electrical signal having a greater frequency than the first frequency value;

applying, via the power source, the voltage across a second Hall effect sensor located in a second stack of the magnetic core;

detecting, by the second Hall effect sensor, second Hall effect data corresponding to a second Hall effect current of the electrical signal having the frequency between zero hertz and the first frequency value; and detecting, by a second coil wound around the second stack of the magnetic core, second coil data corresponding to a second higher-frequency component of the current of the electrical signal having the greater frequency than the first frequency value.

16. The method of claim 15, further comprising receiving, at a via that extends to a first outer surface or a second outer surface of the printed circuit board assembly, at least a portion of the first coil data.

17. The method of claim 15, further comprising:

receiving, at a controller, the first Hall effect data, the second Hall effect data, the first coil data, and the second coil data; and calculating, by the controller, a first portion of the current of the electrical signal and a second portion of the current of the electrical signal based on the first Hall effect data, the second Hall effect data, the first coil data, and the second coil data.

* * * * *